(12) United States Patent
Bae et al.

(10) Patent No.: US 10,840,161 B2
(45) Date of Patent: Nov. 17, 2020

(54) METHOD FOR MANUFACTURING SEMICONDUCTOR PACKAGE SUBSTRATE

(71) Applicant: HAESUNG DS CO., LTD., Changwon-si (KR)

(72) Inventors: In Seob Bae, Changwon-si (KR); Hyeok Jin Jeon, Changwon-si (KR)

(73) Assignee: HAESUNG DS CO., LTD., Changwon-si (KR)

(*) Notice: Subject to any disclaimer, the term of this patent is extended or adjusted under 35 U.S.C. 154(b) by 0 days.

(21) Appl. No.: 16/347,179

(22) PCT Filed: Dec. 5, 2016

(86) PCT No.: PCT/KR2016/014170
§ 371 (c)(1),
(2) Date: May 2, 2019

(87) PCT Pub. No.: WO2018/088624
PCT Pub. Date: May 17, 2018

(65) Prior Publication Data
US 2020/0168521 A1  May 28, 2020

(30) Foreign Application Priority Data
Nov. 9, 2016  (KR) .......... 10-2016-0149095

(51) Int. Cl.
*H01L 23/14* (2006.01)
*H01L 21/324* (2006.01)
(Continued)

(52) U.S. Cl.
CPC .......... *H01L 23/142* (2013.01); *H01L 21/324* (2013.01); *H01L 21/76831* (2013.01); *H01L 23/3178* (2013.01)

(58) Field of Classification Search
CPC ........................................ H01L 21/71
See application file for complete search history.

(56) References Cited

U.S. PATENT DOCUMENTS

2011/0163433 A1* 7/2011 Toda .................. H01L 21/4828
257/676
2013/0214379 A1* 8/2013 Niwa ................. C08G 73/1042
257/499

FOREIGN PATENT DOCUMENTS

JP   2004-071946 A   3/2004
KR   10-2013-0061704 A   6/2013
(Continued)

OTHER PUBLICATIONS

Korean Intellectual Property Office, Office Action in Korean Patent Application No. 10-2016-0149095, dated Dec. 19, 2017, 8 pages, English translation not available.
(Continued)

*Primary Examiner* — Cheung Lee
(74) *Attorney, Agent, or Firm* — Schwabe, Williamson & Wyatt, P.C.

(57) ABSTRACT

A method of manufacturing a semiconductor package substrate includes forming a trench in one surface of a base substrate formed of a conductive material, performing a first filling operation of filling the trench with resin, performing a first curing operation of semi-curing the resin filled in the first filling operation, performing a second filling operation of additionally filling resin on a semi-cured resin, performing a second curing operation of fully curing the resin, removing the resin exposed from the trench, and etching an opposite surface of the base substrate to expose at least part of the resin filling the trench.

15 Claims, 9 Drawing Sheets

(51) Int. Cl.
*H01L 21/768* (2006.01)
*H01L 23/31* (2006.01)

(56) References Cited

FOREIGN PATENT DOCUMENTS

| KR | 10-2013-0090457 A | 8/2013 |
|----|-------------------|--------|
| KR | 10-2015-0083401 A | 7/2015 |
| KR | 10-2015-0083402 A | 7/2015 |

OTHER PUBLICATIONS

Korean Intellectual Property Office, Notice of Allowance in Korean Patent Application No. 10-2016-0149095, dated May 30, 2018, 2 pages, English translation not available.
Taiwan Intellectual Property Office, Office Action and Search Report in Taiwanese Patent Application No. 10720623330, 8 pages, English translation not available.

\* cited by examiner

METHOD FOR MANUFACTURING SEMICONDUCTOR PACKAGE SUBSTRATE

CROSS-REFERENCE TO RELATED APPLICATION

The present application is a national phase entry under 35 U.S.C. § 371 of International Application No. PCT/KR2016/014170, filed Dec. 5, 2016, entitled "METHOD FOR MANUFACTURING SEMICONDUCTOR PACKAGE SUBSTRATE," which designates the United States of America, which claims the benefit of Korean Patent Application No. 10-2016-0149095, filed on Nov. 9, 2016, in the Korean Intellectual Property Office, the disclosure of which is incorporated herein in its entirety by reference.

TECHNICAL FIELD

One or more embodiments relate to a method of manufacturing a semiconductor package substrate.

BACKGROUND ART

Semiconductor devices are used by being packaged on a semiconductor package substrate. Semiconductor package substrates used for packaging have fine circuit patterns and/or I/O terminals. As high performance and/or high integration of a semiconductor device and miniaturization and/or high performance of an electronic apparatus using a semiconductor progress, a line width in a fine circuit pattern of a semiconductor package substrate further decreases and complexity thereof increases as well.

In the manufacture of an existing semiconductor package substrate, a through-hole is formed by using a copper clad laminate (CCL) in which copper foil is coated on an insulating material, and an inner surface of the through-hole is plated with gold to electrically connect an upper surface of copper foil and a lower surface of copper foil. Then, each of the upper surface of copper foil and the lower surface of copper foil is patterned using a photoresist to manufacture the semiconductor package substrate. However, the above conventional semiconductor package substrate manufacturing method may be complicated and have low accuracy.

Recently, a method of manufacturing a semiconductor package substrate by filling an insulating material into a conductive base substrate has been introduced for simplification of a manufacturing process.

DESCRIPTION OF EMBODIMENTS

Technical Problem

One or more embodiments include a method of manufacturing a semiconductor package substrate, by which a manufacturing process is simplified and yield is improved.

Additional aspects will be set forth in part in the description which follows and, in part, will be apparent from the description, or may be learned by practice of the presented embodiments.

Solution to Problem

According to one or more embodiments, a method of manufacturing a semiconductor package substrate includes forming a trench in one surface of a base substrate formed of a conductive material, performing a first filling operation of filling the trench with resin, performing a first curing operation of semi-curing the resin filled in the first filling operation, performing a second filling operation of additionally filling resin on a semi-cured resin, performing a second curing operation of fully curing the resin, removing the resin exposed from the trench, and etching an opposite surface of the base substrate to expose at least part of the resin filling the trench.

Advantageous Effects of Disclosure

As described above, according to the present inventive concept, a conductive base substrate is filled with resin in two steps so that the resin may uniformly fill an overall semiconductor package substrate and generation of voids in the filled resin may be reduced.

BEST MODE

According to one or more embodiments, a method of manufacturing a semiconductor package substrate includes forming a trench in one surface of a base substrate formed of a conductive material, performing a first filling operation of filling the trench with resin, performing a first curing operation of semi-curing the resin filled in the first filling operation, performing a second filling operation of additionally filling resin on a semi-cured resin, performing a second curing operation of fully curing the resin, removing the resin exposed from the trench, and etching an opposite surface of the base substrate to expose at least part of the resin filling the trench.

A highest temperature of the second curing operation may be higher than a highest temperature of the first curing operation.

In the first filling operation and the second filling operation, the resin may be filled by a screen printing coating method, and viscosity of the resin may have a value of 2,000 to 10,000 centipoise (CPS).

The first curing operation and the second curing operation may be performed by using an infrared heater.

The first curing operation may be performed at a temperature in a range of about 60° C. to about 130° C.

The second curing operation may be performed at a temperature in a range of about 60° C. to about 250° C.

In the first curing operation and the second curing operation, a temperature profile according to an elapsed time may gradually increase in a stepped manner according to the elapsed time.

The first curing operation and the second curing operation may include a horizontal drying process in which, after the filling of the resin, the base substrate is dried by being placed horizontally to the ground.

The method may further include roughening an inner surface of the trench.

The method may further include forming a plating layer on at least a part of the base substrate.

According to one or more embodiments, a method of manufacturing a semiconductor package substrate includes forming a trench in one surface of a base substrate formed of a conductive material, performing a first filling operation of filling the trench with liquid resin, performing a first curing operation of semi-curing the liquid resin filled in the first filling operation for about 30 minutes to about 1 hour at a temperature in a range of about 60° C. to about 130° C., performing a second filling operation of additionally filling resin on a semi-cured resin, performing a second curing operation of fully curing the resin for about 1 hour to about 2 hours at a temperature in a range of about 60° C. to about 250° C., removing the resin exposed from the trench, and etching an opposite surface of the base substrate to expose at least part of the resin filling the trench, wherein the resin filled in the first filling operation and the resin filled in the second filling operation are a same material, and an amount of the resin filled in the first filling operation is greater than an amount of the resin filled in the second filling operation.

In the first filling operation and the second filling operation, the resin may be filled by a screen printing coating method, and viscosity of the resin may have a value of 2,000 to 10,000 centipoise (CPS).

The first curing operation and the second curing operation may be performed by using an infrared heater.

In the first curing operation and the second curing operation, a temperature profile according to an elapsed time may gradually increases in a stepped manner according to the elapsed time.

The method may further include forming a plating layer on the base substrate.

Mode of Disclosure

As the inventive concept allows for various changes and numerous embodiments, embodiments will be illustrated in the drawings and described in detail in the written description. However, this is not intended to limit the present inventive concept to particular modes of practice, and it is to be appreciated that all changes, equivalents, and substitutes that do not depart from the spirit and technical scope of the present inventive concept are encompassed in the present inventive concept. In the description of the present inventive concept, certain detailed explanations of the related art are omitted when it is deemed that they may unnecessarily obscure the essence of the inventive concept.

The present inventive concept will now be described more fully with reference to the accompanying drawings, in which embodiments of the inventive concept are shown. Throughout the drawings, like reference numerals in the drawings denote like elements, and thus their description will be omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

In the description of each element, when an element is formed "on" or "under" another element, it will be understood that the element can be directly on the other component or intervening components may be present thereon. The standard for determining the terms "on" and "under" is based on the drawings.

Sizes of components in the drawings may be exaggerated for convenience of explanation. In other words, since sizes and thicknesses of components in the drawings are arbitrarily illustrated for convenience of explanation, the following embodiments are not limited thereto.

Figure 1:
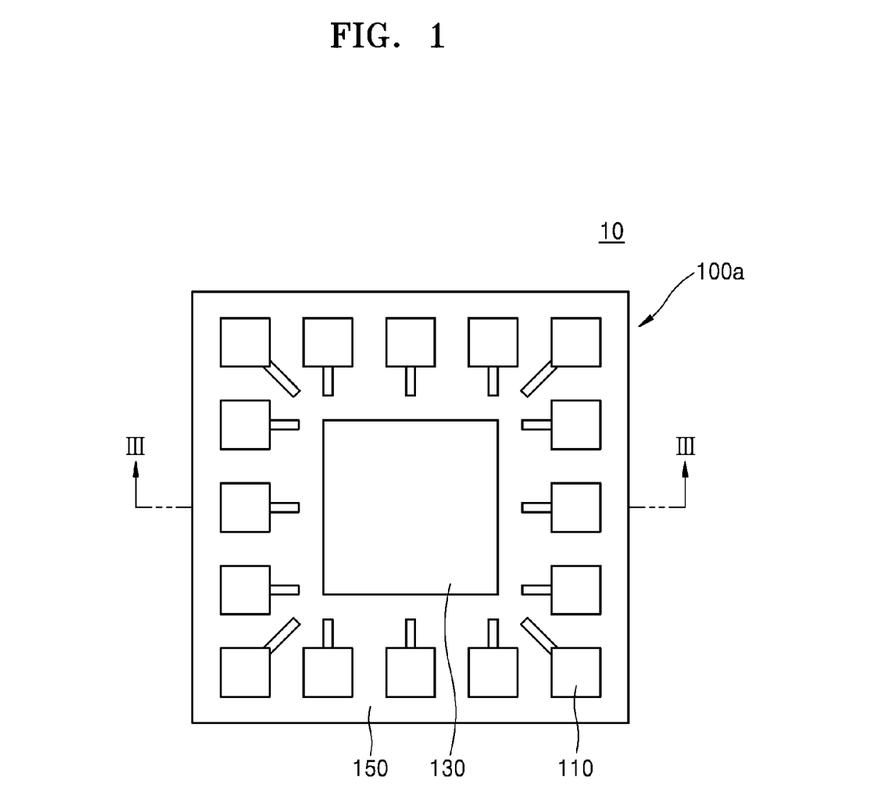
FIG. 1 is a schematic plan view of an upper surface of a semiconductor package substrate according to an embodiment.
Figure 2:
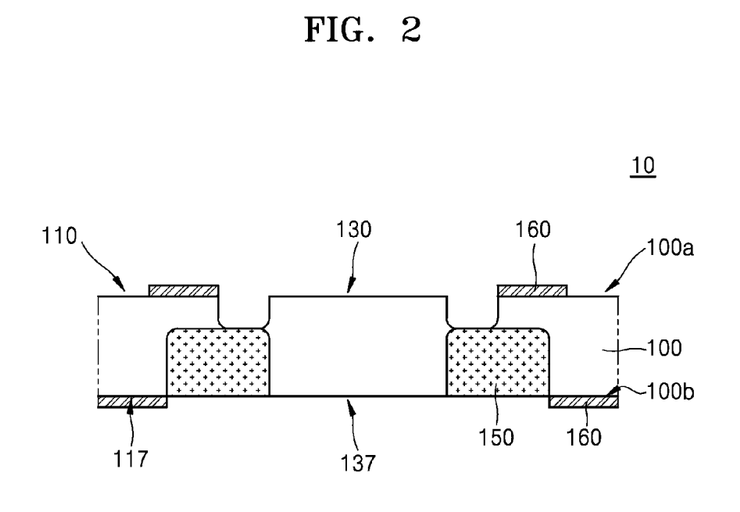
FIG. 2 is a cross-sectional view taken along line III-III' of FIG. 1.

FIG. 1 is a schematic plan view of an upper surface 100a of a semiconductor package substrate 10 according to an embodiment. FIG. 2 is a cross-sectional view taken along line III-III' of FIG. 1.

Referring to FIGS. 1 and 2, the semiconductor package substrate 10 according to the present embodiment may include the upper surface 100a and a lower surface 100b, and a base substrate 100 formed of a conductive material is filled with resin 150 formed of an insulating material. A die pad 130 and a lead 110 are provided on the upper surface 100a.

The upper surface 100a of the base substrate 100 may refer to a side where a semiconductor chip is provided when a semiconductor package is manufactured by using the semiconductor package substrate 10, and the lower surface 100b may refer to a surface opposite to the upper surface 100a.

The base substrate 100 is formed of a conductive material and may have a flat panel shape. For example, the base substrate 100 may include Fe or an Fe alloy such as Fe—Ni or Fe—Ni—Co, or Cu or a Cu alloy such as Cu—Sn, Cu—Zr, Cu—Fe, or Cu—Zn.

The resin 150 may be formed of an insulating material that is not electrically conductive. The resin 150 may later electrically insulate between wiring patterns of the semiconductor package substrate 10. The resin 150 may be arranged between the die pad 130 and the lead 110 to insulate the die pad 130 and the lead 110 from each other. At least part of the resin 150 may be arranged under the lead 110. Furthermore, the resin 150 is arranged between the wiring patterns of the semiconductor package substrate 10 and may maintain strength of the semiconductor package substrate 10. Accordingly, as the resin 150 is uniformly filled in the base substrate 100, strength of the semiconductor package substrate 10 may be uniform.

The die pad 130 is a portion where the semiconductor chip is to be mounted. The die pad 130 may be located at the center portion of the semiconductor package substrate 10, but the present disclosure is not limited thereto. The die pad 130 is formed by patterning the base substrate 100 and may be formed of the same conductive material as the base substrate 100.

The lead 110 is arranged around the die pad 130 so as to be electrically insulated from the die pad 130. The lead 110 may be provided as a plurality thereof, and may have a specific pattern. The lead 110 is electrically connected to the semiconductor chip and is a portion to be electrically connected to an external circuit. The lead 110 may be formed by patterning the base substrate 100 and may be formed of the same conductive material as the base substrate 100. The die pad 130 and the lead 110 may be formed from the base substrate 100 and may be formed of the same conductive material.

The lead 110 is connected to a lead land 117 arranged on the lower surface 100b of the base substrate 100. Since the lead land 117 is integrally formed with the lead 110, the lead land 117 may be formed of the same conductive material as the lead 110. The lead land 117 is electrically and physically connected to an external circuit by solder balls, and may connect the semiconductor package substrate 10 and the external circuit to each other.

The die pad 130 is connected to a die land 137 arranged on the lower surface 100b of the base substrate 100. Since the die land 137 is integrally formed with the die pad 130, the die land 137 may be formed of the same conductive material as the die pad 130. The die land 137 that is electrically and physically connected to the external circuit by solder balls may connect the semiconductor package substrate 10 and the external circuit to each other.

A plating layer 160 may be partially formed on the lead 110 and/or the lead land 117. The plating layer 160 may be plated by using Au, Ag, Ni, or Pd. The plating layer 160 may increase a wire bonding force of the lead 110 or a solder bonding force of the lead land 117. The plating layer 160 may be formed in an area, such as that of the die pad 130 and/or the die land 137, in which it is not yet formed in the drawing.

Figure 3:
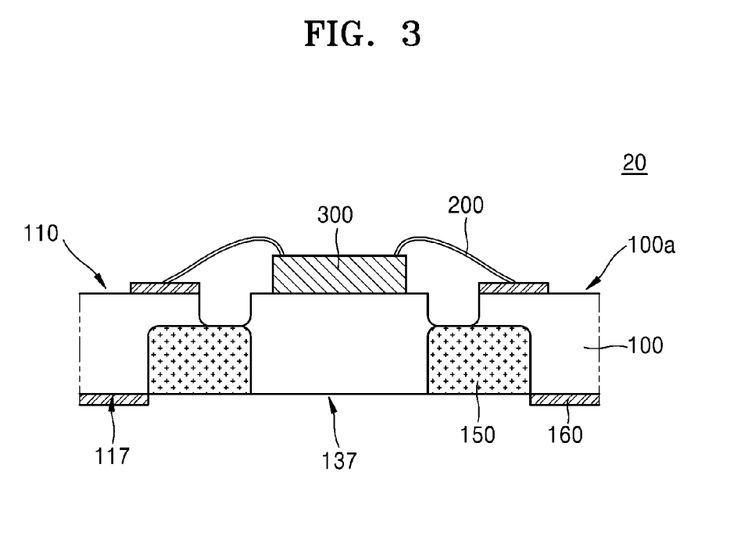
FIG. 3 is a cross-sectional view of a semiconductor package substrate mounted with a semiconductor chip.

FIG. 3 is a cross-sectional view of a semiconductor package substrate 20 mounted with a semiconductor chip. In FIG. 3, the same reference numerals as the reference numerals in FIG. 2 denote the same elements, and thus their descriptions are omitted for simplification of explanation.

In the semiconductor package substrate 20, the base substrate 100 formed of a conductive material is filled with the resin 150 formed of an insulating material, and the die pad 130 and the lead 110 are provided on the upper surface 100a of the base substrate 100.

A semiconductor chip 300 is mounted on a flat upper surface of the die pad 130. The die pad 130 and the lead 110 may be electrically and physically connected to each other by a wire 200. The wire 200 may be connected to the semiconductor chip 300 and the lead 110 by wire bonding. One end of the wire 200 is attached to the lead 110, and the other end of the wire 200 is connected to the semiconductor chip 300.

Figure 4:
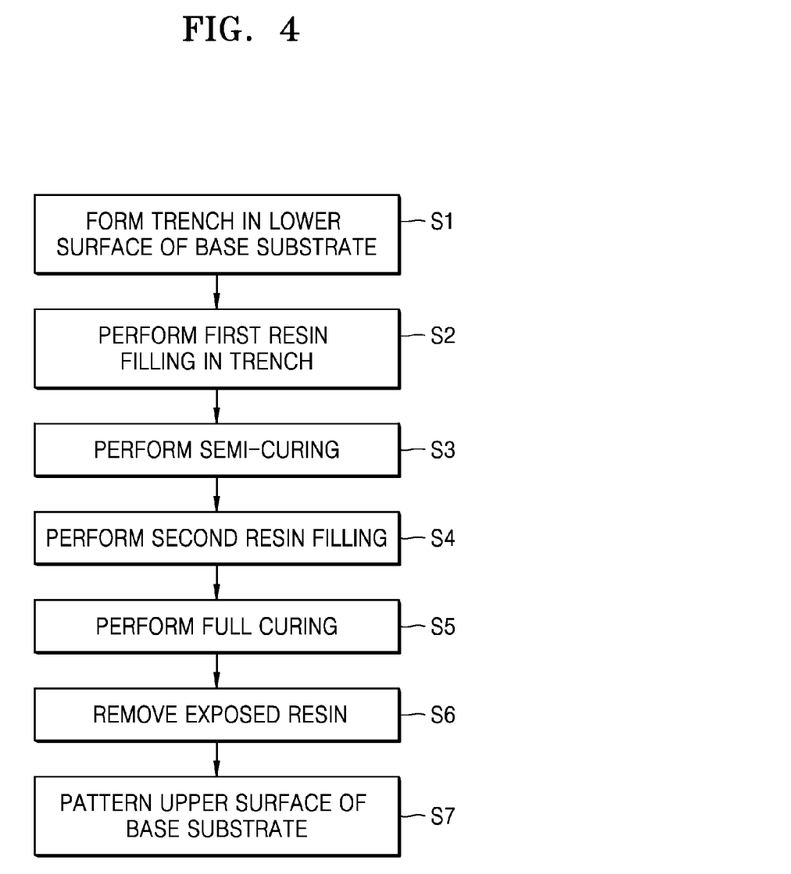
FIG. 4 is a flowchart of a method of manufacturing a semiconductor package substrate according to an embodiment.

FIG. 4 is a flowchart of a method of manufacturing a semiconductor package substrate according to an embodiment.

Referring to FIG. 4, the method of manufacturing a semiconductor package substrate according to the present embodiment may include forming a trench in one surface of a base substrate formed of a conductive material (S1), filling the trench with resin (first filling operation; S2), semi-curing the resin filled in the first filling operation (first curing operation; S3), additionally filling resin on the semi-cured resin (second filling operation; S4), fully curing the resin (second curing operation; S5), removing resin exposed from the trench (S6), and etching another surface of the base substrate such that at least part of the resin filling the trench is exposed (S7).

The method of manufacturing the semiconductor package substrate 10 according to the present embodiment is described in detail with reference to FIGS. 5A to 5J.

Figure 5A:
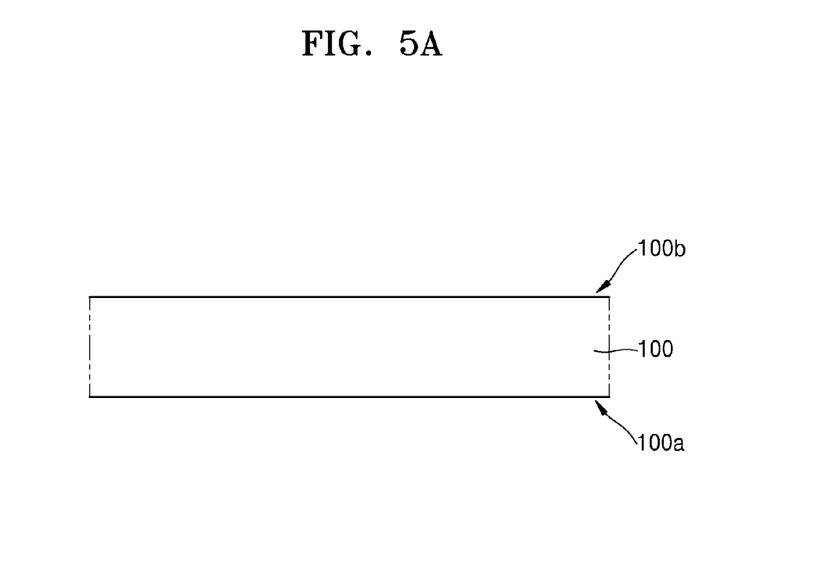
FIGS. 5A to 5J are sectional views sequentially illustrating a method of manufacturing a semiconductor package substrate according to an embodiment.

First, referring to FIG. 5A, the base substrate 100 formed of a conductive material is prepared. The base substrate 100 may have a flat panel shape and include a conductive material. The base substrate 100 may include Fe or an Fe alloy such as Fe—Ni or Fe—Ni—Co, or Cu or a Cu alloy such as Cu—Sn, Cu—Zr, Cu—Fe, or Cu—Zn. The base substrate 100 may include the upper surface 100a where a semiconductor chip is to be mounted, and the lower surface 100b opposite to the upper surface 100a. In some embodiments, a thickness t of the base substrate 100 may be about 0.1 mm to about 0.3 mm.

Figure 5B:
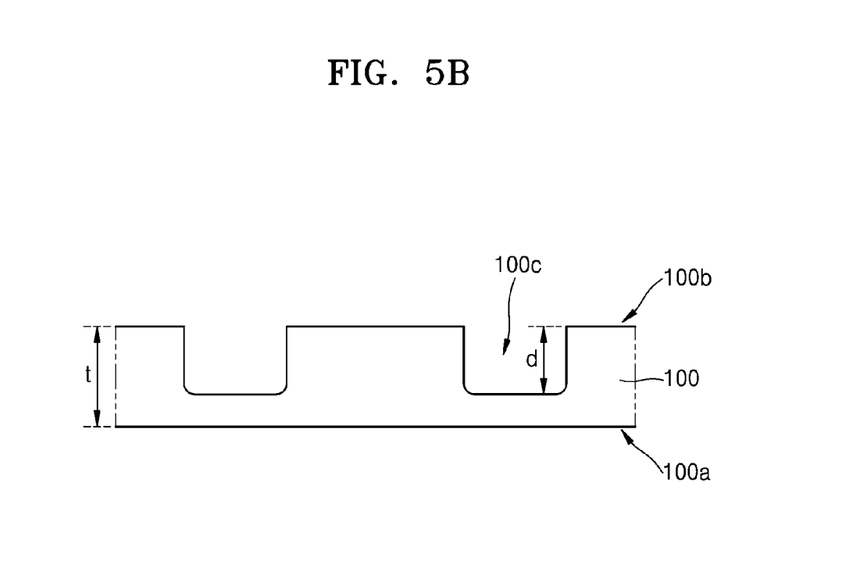

Next, referring to FIG. 5B, a trench 100c is formed by half etching the lower surface 100b of the base substrate 100. This indicates that, in this case, the trench 100c does not completely penetrate through the base substrate 100.

In order to form the trench 100c, a photoresist (PR) formed of a photosensitive material is coated on the lower surface 100b of the base substrate 100, and exposure and development processes are performed by using a mask to thereby expose only a portion where the trench 100c of the base substrate 100 is to be formed. Then, a portion of the lower surface 100b of the base substrate 100, which is not covered with the PR, is etched by using an etchant such as copper chloride or iron chloride, so that, as illustrated in FIG. 5B, the trench 100c may be formed in the lower surface 100b without penetrating through the base substrate 100.

A depth d of the trench 100c may be about 50% to about 90% of the thickness t of the base substrate 100. In some embodiments, the depth d of the trench 100c may be about 75 μm to about 200 μm. The depth d of the trench 100c may be adjusted in subsequent processes in consideration of ease of handling of a semiconductor package substrate, and a condition for a process of patterning the upper surface 100a.

In the present embodiment, the filling of the trench 100c with resin is performed in two steps.

When the trench 100c is filled with resin at one time, solvent included in the resin which is a liquid evaporates during curing or a volume of the resin shrinks during curing so that voids may be generated inside the trench 100c or an incomplete mold phenomenon may occur in which a depth of filled resin is smaller than a depth of the trench 100c. In other words, the trench 100c may not be fully filled with the resin. In particular, when the depth d of the trench 100c is about 120 μm or more, the generation of voids or the incomplete mold phenomenon is highly likely to occur.

In the present embodiment, in which the filling of the trench 100c with resin is performed in two steps, thus reducing the generation of voids in the resin filling the trench 100c and occurrence of the incomplete mold phenomenon, the semiconductor package substrates 10 and 20 may be uniformly filled with the resin 150.

A method of filling resin according to an embodiment is described below in detail.

Figure 5C:
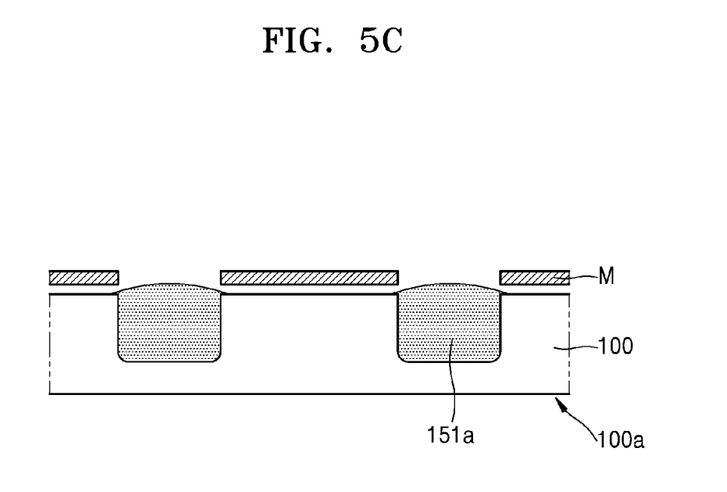

Referring to FIG. 5C, the first filling operation of filling the trench 100c of the base substrate 100 with resin 151a is performed (S2).

It suffices that the resin 151a is formed of an insulating material that is not electrically conductive. For example, the resin 151a may be thermosetting resin that is polymerized and cured by thermal treatment. The resin 151a may be liquid resin.

When the resin 151a is liquid resin, the resin 151a may be coated in the trench 100c by a screen printing coating method. According to the screen printing coating method, the resin 151a is coated by using a screen mask M, in which only an area where the resin 151a is filled is open, and thus the resin 151a is not coated in an unnecessary area, which reduces the cost of materials.

When the screen printing coating method is used, viscosity of the resin 151a may be about 2,000 to 10,000 centipoise (CPS). When the viscosity of the resin 151a is higher than 10,000 CPS, the resin 151a adheres to the screen mask M such that the resin 151a may not uniformly fill the trench 100c.

The present disclosure is not limited to the above method. The resin 151a may be coated by various methods in addition to the screen printing coating method. Furthermore, the resin 151a is not limited to being liquid resin. For example, the resin 151a may be formed of a solid tape including a resin component.

Figure 5D:
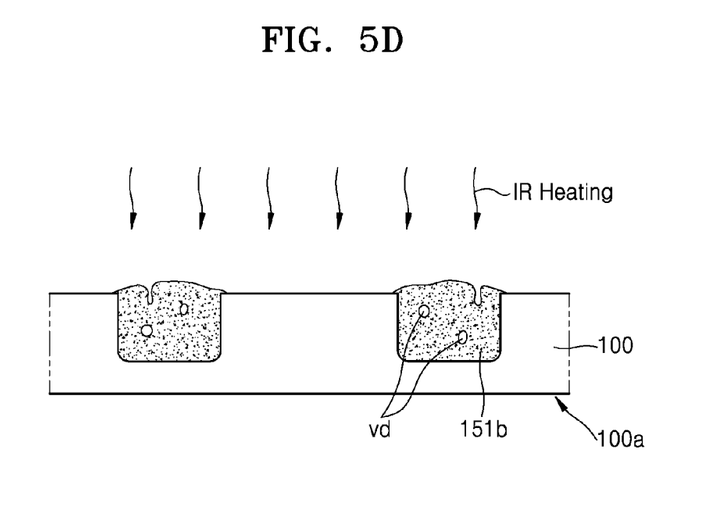

Next, referring to FIG. 5D, the first curing operation S3 of forming semi-cured resin 151b by semi-curing the resin 151a filled in the first filling operation is performed.

In the first curing operation S3, the semi-cured resin 151b is formed by semi-curing the resin 151a, not by fully curing the same. The semi-curing may be performed through heat treatment using an oven. In some embodiments, the first curing operation may be performed by using an infrared (IR) heater. An IR ray may intrude into the inside of the resin 151a to sufficiently evaporate the solvent in the resin 151a, to thereby uniformly cure the resin 151a.

A highest temperature of the first curing operation may be lower than a highest temperature of the second curing operation that is a subsequent process. A duration of the first curing operation may be shorter than that of the second curing operation. In some embodiments, the first curing operation may be performed for about 30 minutes to about 1 hour at a temperature ranging from about 60° C. to about 130° C.

Figure 5E:
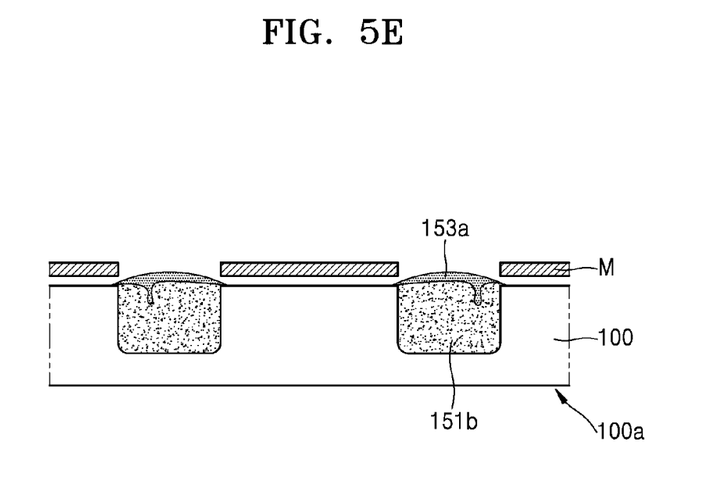
Figure 5F:
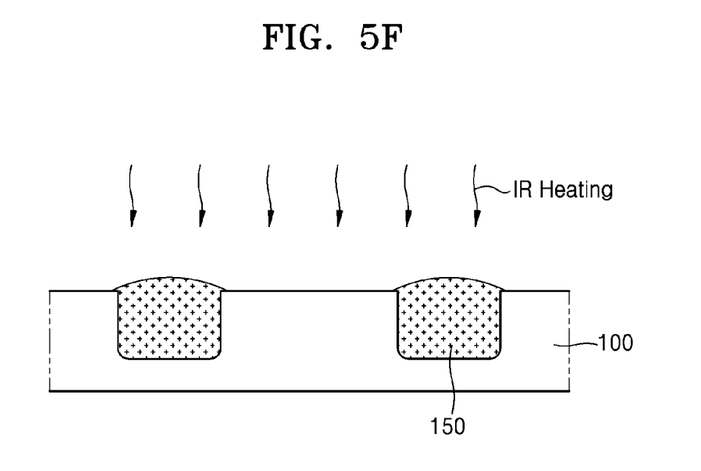
Figure 5G:
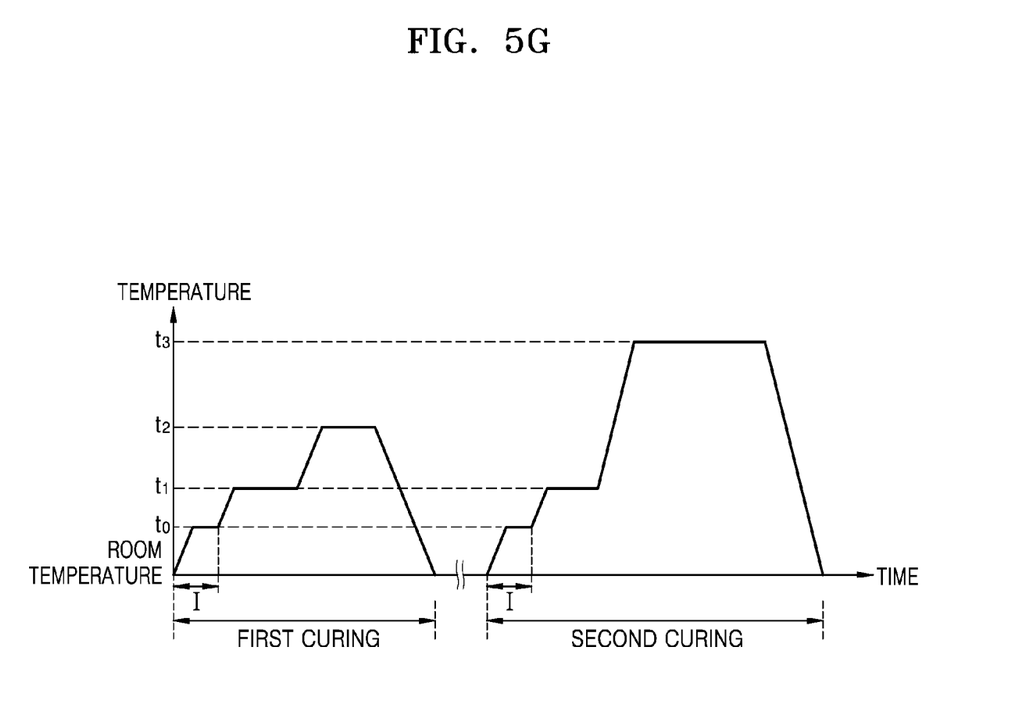

In some embodiments, a temperature profile of the first curing operation according to an elapsed time may have a shape of a gradual increase in a stepped manner according to the elapsed time as illustrated in FIG. 5G. This is because the resin 151a is slowly heated so that the resin 151a is fully and uniformly cured. The temperature profile is not limited to the gradual increase in a stepped manner. For example, the temperature profile may include a gradual and slow increase.

Furthermore, the first curing operation may include a horizontal drying process I. In the horizontal drying process I, while the base substrate 100 is placed horizontally to the ground, the resin 151a is dried at a low temperature to reduce fluidity of the resin 151a so that the resin 151a does not flow away. In some embodiments, the horizontal drying process I may be performed for about 5 to 10 minutes at a temperature ranging from about 60° C. to about 90° C.

In the first curing operation, the resin 151a is semi-cured and not fully cured because, when the resin 151a is fully cured, exfoliation may be generated at a boundary between the semi-cured resin and resin additionally filled in the subsequent second filling process.

Furthermore, by semi-curing the resin 151a to be in a slightly fluid state, voids Vd in the semi-cured resin 151b may be removed in the subsequent process. When the resin 151a is semi-cured by applying heat thereto, the solvent included in the resin 151a evaporates so that voids Vd may be partially generated in the semi-cured resin 151b. Furthermore, a shrinking phenomenon is generated due to heat such that an incomplete mold phenomenon may occur in which the semi-cured resin 151b is partially filled so as to be lower than the depth of the trench 100c.

To fill the void Vd and a part of an incomplete mold, as illustrated in FIG. 5E, the second filling operation S4 is performed.

In the second filling operation, liquid resin 153a is additionally coated on the semi-cured resin 151b. It is sufficient that the liquid resin 153a is formed of an insulating material that is not electrically conductive. For example, the liquid resin 153a may be thermosetting resin that is polymerized and cured through heat treatment. In this state, the liquid resin 153a may be the same as the resin 151a of the first filling operation. However, the present disclosure is not limited thereto. The liquid resin 153a of the second filling operation may be a different type of resin from the resin 151a of the first filling operation.

The amount of the added liquid resin 153a may be smaller than the amount of the resin 151a filled in the first filling operation. In other words, the resin 151a filled in the first filling operation may fill most of the trench 100c, and the added liquid resin 153a may fill a part of the trench 100c not filled during the curing. In some embodiments, the amount of the added liquid resin 153a may be about 5% to about 20% of the amount of the resin 151a filled in the first filling operation.

In some embodiments, the liquid resin 153a may be coated on the trench 100c by the screen printing coating method. The screen printing coating method is a technology for coating only an area filled with the liquid resin 153a by using the screen mask M that is open. According to the screen printing coating method, since resin is not coated in an unnecessary area, the cost of materials may be reduced.

When the screen printing coating method is used, viscosity of the liquid resin 153a may be about 2,000 to 10,000 CPS. When the viscosity of the liquid resin 153a is higher than 10,000 CPS, the liquid resin 153a adheres to the screen mask M so as not to be uniformly coated.

The coating of the liquid resin 153a may be performed by a variety of methods in addition to the screen printing coating method, and the present disclosure is not limited thereto.

The added liquid resin 153a may be coated on the semi-cured resin 151b so as to fill the voids Vd of the semi-cured resin 151b and the incompletely filled part of the trench 100c. Furthermore, as the semi-cured resin 151b has slight fluidity, the semi-cured resin 151b is pressed by the added liquid resin 153a so that the volume of voids Vd may be reduced or removed.

Next, as illustrated in FIG. 5F, the second curing operation S5 of fully curing the semi-cured resin 151b and the added liquid resin 153a is performed.

The second curing operation may be performed through heat treatment by using an oven. In some embodiments, the second curing operation may be performed by an IR heater. An IR ray may intrude into the inside of the resin 151a to sufficiently evaporate the solvent in the resin 151a and thereby uniformly cure the resin 151a.

A highest temperature t3 of the second curing operation may be higher than a highest temperature t2 of the first curing operation. A duration of the second curing operation may be longer than that of the first curing operation.

In some embodiments, the first curing operation may be performed for about 30 minutes to about 1 hour at a temperature ranging from about 60° C. to about 130° C., and the second curing operation may be performed for about 1 hour to about 2 hours at a temperature ranging from about 60° C. to about 250° C. When the curing operations are performed under such curing conditions, exfoliation is not generated at the boundary between the first filled resin and the second filled resin and thus the first filled resin is appropriately semi-cured so that the first filled resin may not be peeled off in the subsequent process.

In some embodiments, a temperature profile of the second curing operation according to an elapsed time may have a shape of a gradual increase in a stepped manner according to the elapsed time as illustrated in FIG. 5G. This is because the semi-cured resin 151b and the liquid resin 153a are slowly heated so that the semi-cured resin 151b and the liquid resin 153a are fully and uniformly cured. The temperature profile is not limited to the gradual increase in a stepped manner. For example, the temperature profile may include a gradual and slow increase.

Furthermore, the second curing operation may include the horizontal drying process I. In the horizontal drying process I, while the base substrate 100 is placed horizontally to the ground, the liquid resin 153a is dried at a low temperature to reduce the fluidity of the liquid resin 153a so that the liquid resin 153a does not flow away. In some embodiments, the horizontal drying process I may be performed for about 5 to 10 minutes at a temperature ranging from about 60° C. to about 90° C.

The semi-cured resin 151b and the added liquid resin 153a form the resin 150 that is fully cured through the second curing operation.

FIG. 5G is a graph showing the temperature profiles of the first curing operation and the second curing operation, according to an embodiment. Referring to FIG. 5G, as described above, the highest temperature t2 of the first curing operation is lower than the highest temperature t3 of the second curing operation, and the duration of the first curing operation may be shorter than the duration of the second curing operation. Furthermore, temperature gradually increases in the stepped manner in the first and second curing operations, which may include the horizontal drying process I. However, this is merely an example and the present disclosure is not limited thereto.

Figure 5H:
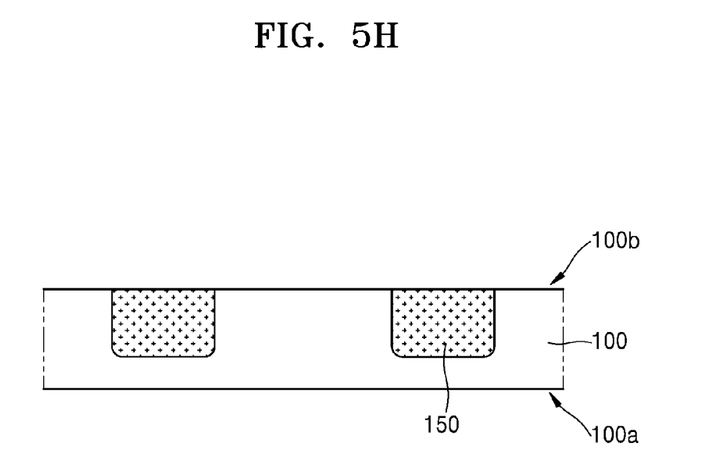

Next, as illustrated in FIG. 5H, the resin 150 exposed from the base substrate 100 is removed (S6).

The resin 150 that is fully cured may cover not only the inside of the trench 100c, but also at least a part of the lower surface 100b of the base substrate 100. As such, when the resin 150 is coated excessively, the resin 150 that is coated excessively is removed by mechanical processing such as brushing, grinding, or polishing, or by chemical resin etching. Accordingly, as illustrated in FIG. 5H, the resin 150 may be located only in the trench 100c of the base substrate 100.

Figure 5I:
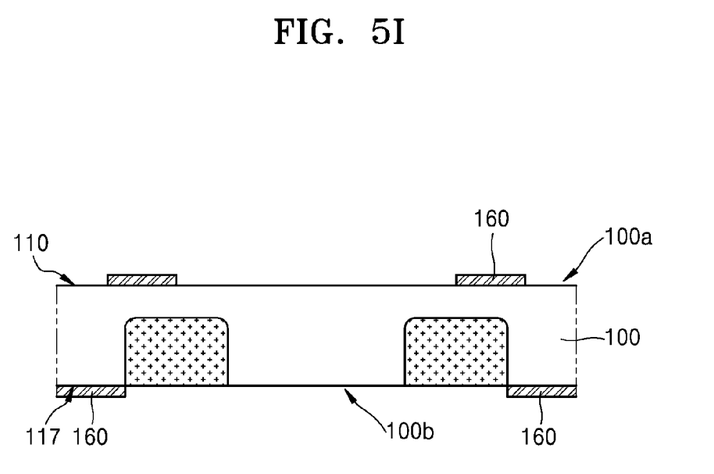

Next, as illustrated in FIG. 5I, the plating layer 160 may be partially formed on the lead 110 and/or a lead land 117. The plating layer 160 may be plated by using Au, Ag, Ni, Pd, etc. The plating layer 160 may improve a wire bonding force of the lead 110 or a solder adhesive force of the lead pad 115. The formation of the plating layer 160 may be performed after patterning the upper surface 100a of the base substrate 100, or omitted.

Figure 5J:
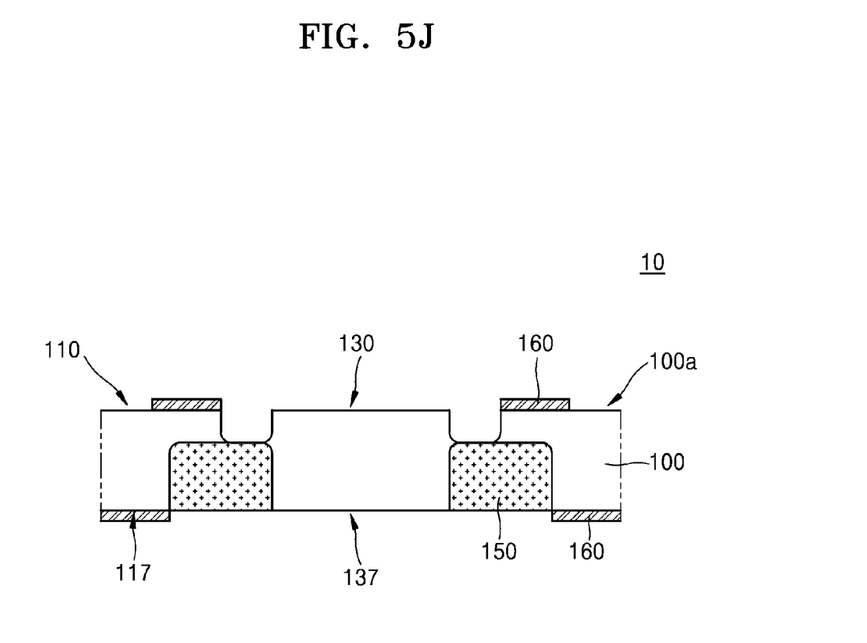

Thereafter, the upper surface 100a of the base substrate 100 is etched (S7). In other words, as illustrated in FIG. 5J, the resin 150 filling the trench 100c is exposed above the base substrate 100 so that the die pad 130 and the lead 110 are insulated from each other.

The upper surface 100a of the base substrate 100 may be etched in various methods. For example, a dry film photoresist (DFR) including a photosensitive material is laminated on the upper surface 100a of the base substrate 100 and undergoes exposure and development so that only a portion of the upper surface 100a of the base substrate 100 to be etched away is exposed. Then, the portion of the upper surface 100a of the base substrate 100 that is not covered by the DFR is etched by using an etchant such as copper chloride or iron chloride. Accordingly, as illustrated in FIG. 5J, at least a part of the resin 150 may be exposed from the upper surface 100a of the base substrate 100.

In the methods of manufacturing a semiconductor package substrate according to the above-described embodiments, a process of roughening the inner surface of the trench 100c may be performed prior to the filling of the resin 151a in the trench 100c of the base substrate 100. Accordingly, a bonding force between the resin 150 and the base substrate 100 may be remarkably increased. To roughen the inner surface of the trench 100c of the base substrate 100, plasma processing, ultraviolet processing, or an acid-based solution may be used. In this case, the roughness of the inner surface of the trench 100c of the base substrate 100 may be about 150 nm or more (rms).

Furthermore, although FIGS. 5A to 5J only illustrate a part of the semiconductor package substrate 10 having a flat plate shape, the present inventive concept may be applied to a method of manufacturing a semiconductor package substrate in which the semiconductor package substrate 10 is wound in a reel type.

Although the method of manufacturing a semiconductor package substrate is described above, the present disclosure is not limited thereto. For example, a semiconductor package manufactured by using the above manufacturing method may belong to the scope of the present inventive concept.

As described above, according to the present inventive concept, a conductive base substrate is filled with resin in two steps so that the resin may uniformly fill an overall semiconductor package substrate and generation of voids in the filled resin may be reduced.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing a semiconductor package substrate, the method comprising:
    forming a trench in one surface of a base substrate formed of a conductive material;
    performing a first filling operation of filling the trench with liquid resin;
    performing a first curing operation of semi-curing the liquid resin filled in the first filling operation;
    performing a second filling operation of additionally filling liquid resin on a semi-cured resin;
    performing a second curing operation of fully curing the liquid resin;
    removing the resin exposed from the trench after the second curing operation; and
    etching an opposite surface of the base substrate to expose at least part of the resin filling the trench.

2. The method of claim 1, wherein a highest temperature of the second curing operation is higher than a highest temperature of the first curing operation.

3. The method of claim 1, wherein the amount of the added liquid resin the second filling operation is 5% to 20% of the amount of the liquid resin in filled in the first filling operation, and wherein, in the first filling operation and the second filling operation, the liquid resin is filled by a screen printing coating method, and viscosity of the resin has a value of 2,000 to 10,000 centipoise (CPS).

4. The method of claim 1, wherein the first curing operation and the second curing operation are performed by using an infrared heater.

5. The method of claim 1, wherein the first curing operation is performed at a temperature in a range of about 60° C. to about 130° C.

6. The method of claim 1, wherein the second curing operation is performed at a temperature in a range of about 60° C. to about 250° C.

7. The method of claim 1, wherein, in the first curing operation and the second curing operation, a temperature profile according to an elapsed time gradually increases in a stepped manner according to the elapsed time.

8. The method of claim 1, wherein the first curing operation and the second curing operation comprise a horizontal drying process in which, after the filling of the liquid resin, the base substrate is dried by being placed horizontally to the ground.

9. The method of claim 1, further comprising roughening an inner surface of the trench.

10. The method of claim 1, further comprising forming a plating layer on at least a part of the base substrate.

11. A method of manufacturing a semiconductor package substrate, the method comprising:
forming a trench in one surface of a base substrate formed of a conductive material;
performing a first filling operation of filling the trench with liquid resin;
performing a first curing operation of semi-curing the liquid resin filled in the first filling operation for about 30 minutes to about 1 hour at a temperature in a range of about 60° C. to about 130° C.;
performing a second filling operation of additionally filling resin on a semi-cured resin;
performing a second curing operation of fully curing the resin for about 1 hour to about 2 hours at a temperature in a range of about 60° C. to about 250° C.;
removing the resin exposed from the trench after the second curing operation; and
etching an opposite surface of the base substrate to expose at least part of the resin filling the trench,
wherein the resin filled in the first filling operation and the resin filled in the second filling operation are a same material, and an amount of the resin filled in the first filling operation is greater than an amount of the resin filled in the second filling operation.

12. The method of claim 11, wherein, in the first filling operation and the second filling operation, the resin is filled by a screen printing coating method, and viscosity of the resin has a value of 2,000 to 10,000 centipoise (CPS).

13. The method of claim 11, wherein the first curing operation and the second curing operation are performed by using an infrared heater.

14. The method of claim 11, wherein, in the first curing operation and the second curing operation, a temperature profile according to an elapsed time gradually increases in a stepped manner according to the elapsed time.

15. The method of claim 11, further comprising forming a plating layer on the base substrate.

* * * * *